United States Patent [19]

Krishnamurthy et al.

[11] Patent Number: 5,508,748
[45] Date of Patent: Apr. 16, 1996

[54] DATA LEVEL SELECTION FOR MULTILEVEL VSB TRANSMISSION SYSTEM

[75] Inventors: Gopalan Krishnamurthy, Wheeling; Timothy G. Laud, Mundelein, both of Ill.

[73] Assignee: Zenith Electronics Corporation, Glenview, Ill.

[21] Appl. No.: 225,201

[22] Filed: Apr. 8, 1994

Related U.S. Application Data

[63] Continuation-in-part of Ser. No. 175,061, Dec. 29, 1993, abandoned, and Ser. No. 14,889, Feb. 8, 1993, Pat. No. 5,406,587.

[51] Int. Cl.[6] .............................. H04N 7/08; H03C 1/00; H03M 7/00
[52] U.S. Cl. ................... 348/475; 375/270; 375/277; 341/56
[58] Field of Search .............................. 348/475, 726, 348/638, 724; 375/43, 61; 341/50, 52, 55, 56, 57, 62, 94, 200; H04N 7/08

[56] References Cited

U.S. PATENT DOCUMENTS

| | | | |
|---|---|---|---|
| 5,087,975 | 2/1992 | Citta et al. .............................. | 348/724 |
| 5,410,368 | 4/1995 | Krishnamurthy ....................... | 348/638 |

FOREIGN PATENT DOCUMENTS

| | | | |
|---|---|---|---|
| 0485108 | 5/1992 | European Pat. Off. ......... | H04N 7/08 |
| 0584865 | 3/1994 | European Pat. Off. ........ | H04L 25/49 |
| 372722 | 3/1991 | Japan ..................................... | 341/200 |
| 9217971 | 10/1992 | WIPO ............................ | H04L 27/34 |

OTHER PUBLICATIONS

IEEE Transaction on Communications, vol. 37, No. 6, Jun. '89, pp. 626–634 "Influence of Coding & Hardware Imperfections on the Bit Error Structure of Multilevel QAM Systems," Bessai & Lorek.

IEEE Global Telecommunications Conf. & Exhibition, Hollywood, vol. 2, Nov. 28, 1988, pp. 858–864, Modified 256-QAM for Logarithmic PCM, Sundberg, Wong & Steele.

*Primary Examiner*—James J. Groody
*Assistant Examiner*—Cheryl Cohen

[57] ABSTRACT

A system for determining the data bits represented by the received symbols of one or more data constellations includes converting the received symbols into multi-bit values (preferably in two's complement form), selecting a number of the most significant bits of each of the multi-bit values and inverting the most significant bit thereof to derive the data bits represented by the respective symbol.

25 Claims, 7 Drawing Sheets

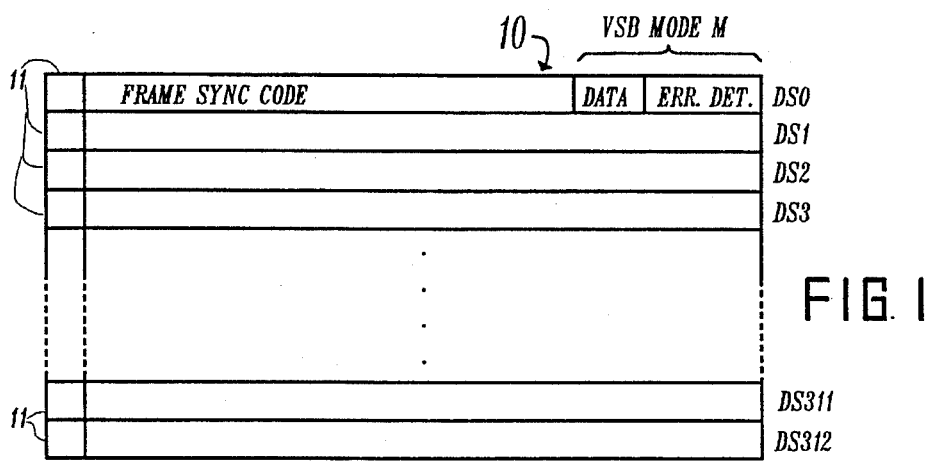
FIG. 1
FIG. 2
| VSB MODE M | DATA SYMBOLS PER FRAME | BITS PER SYMBOL | DATA BYTES PER FRAME | RS BLOCKS PER FRAME | INTERLEAVE BLOCKS PER FRAME |
|---|---|---|---|---|---|
| 24 | 259,584 | 4.5 | 146,016 | 702 | 5616 |
| 16 | 259,584 | 4 | 129,792 | 624 | 4992 |
| 8 | 259,584 | 3 | 97,344 | 468 | 3744 |
| 4 | 259,584 | 2 | 64,896 | 312 | 2496 |
| 2 | 259,584 | 1 | 32,448 | 156 | 1248 |
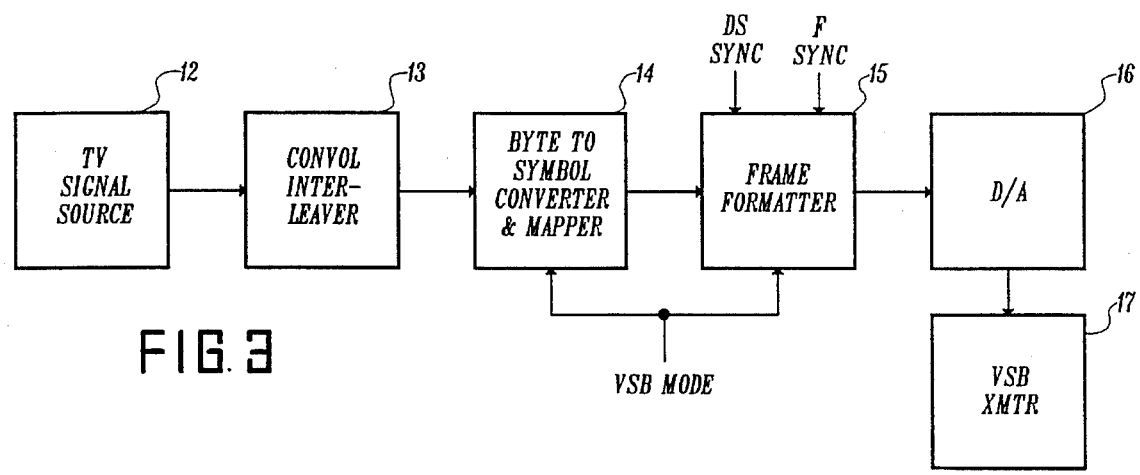
FIG. 3

| VSB MODE M=16 | VSB MODE M=8 | VSB MODE M=4 | VSB MODE M=2 |
|---|---|---|---|
| -------- | -------- | -------- | -------- |
| 1111  +240 | | | |
| -------- | 111  +224 | | |
| 1110  +208 | | | |
| -------- | -------- | 11  +192 | |
| 1101  +176 | | | |
| -------- | 110  +160 | | |
| 1100  +144 | | | |
| -------- | -------- | -------- | 1  +128 |
| 1011  +112 | | | |
| -------- | 101  +96 | | |
| 1010  +80 | | | |
| -------- | -------- | 10  +64 | |
| 1001  +48 | | | |
| -------- | 100  +32 | | |
| 1000  +16 | | | |
| -------- | -------- | -------- | -------- |
| 0111  −16 | | | |
| -------- | 011  −32 | | |
| 0110  −48 | | | |
| -------- | -------- | 01  −64 | |
| 0101  −80 | | | |
| -------- | 010  −96 | | |
| 0100  −112 | | | |
| -------- | -------- | -------- | 0  −128 |
| 0011  −144 | | | |
| -------- | 001  −160 | | |
| 0010  −176 | | | |
| -------- | -------- | 00  −192 | |
| 0001  −208 | | | |
| -------- | 000  −224 | | |
| 0000  −240 | | | |
| -------- | -------- | -------- | -------- |

FIG. 3A

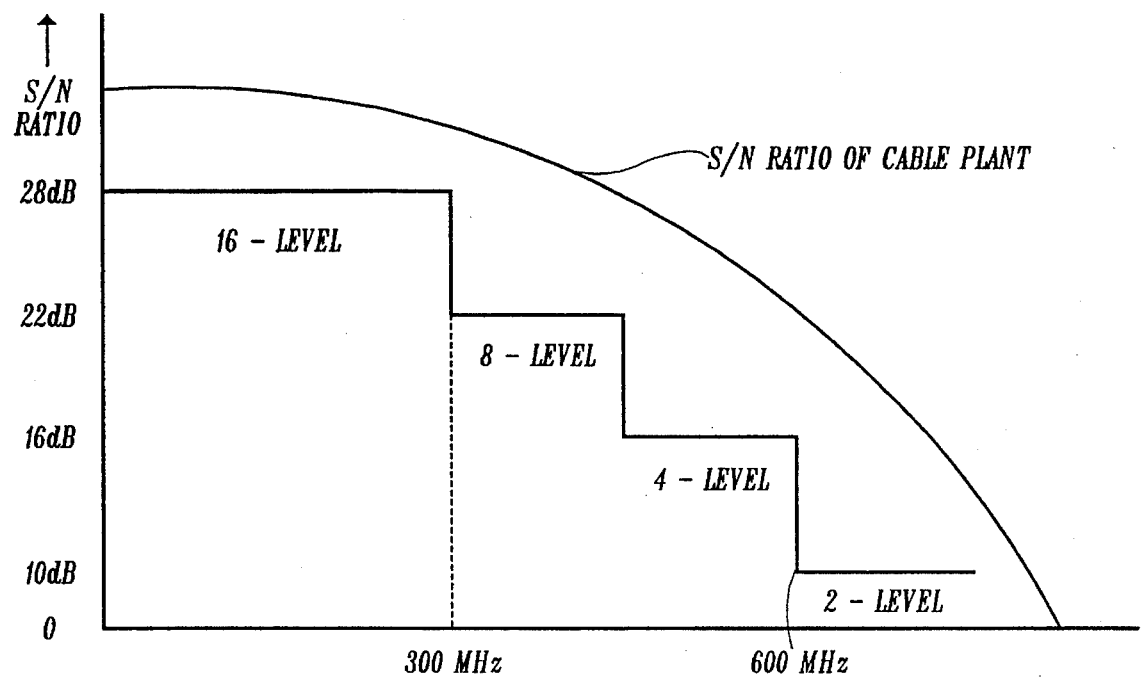

FIG. 4
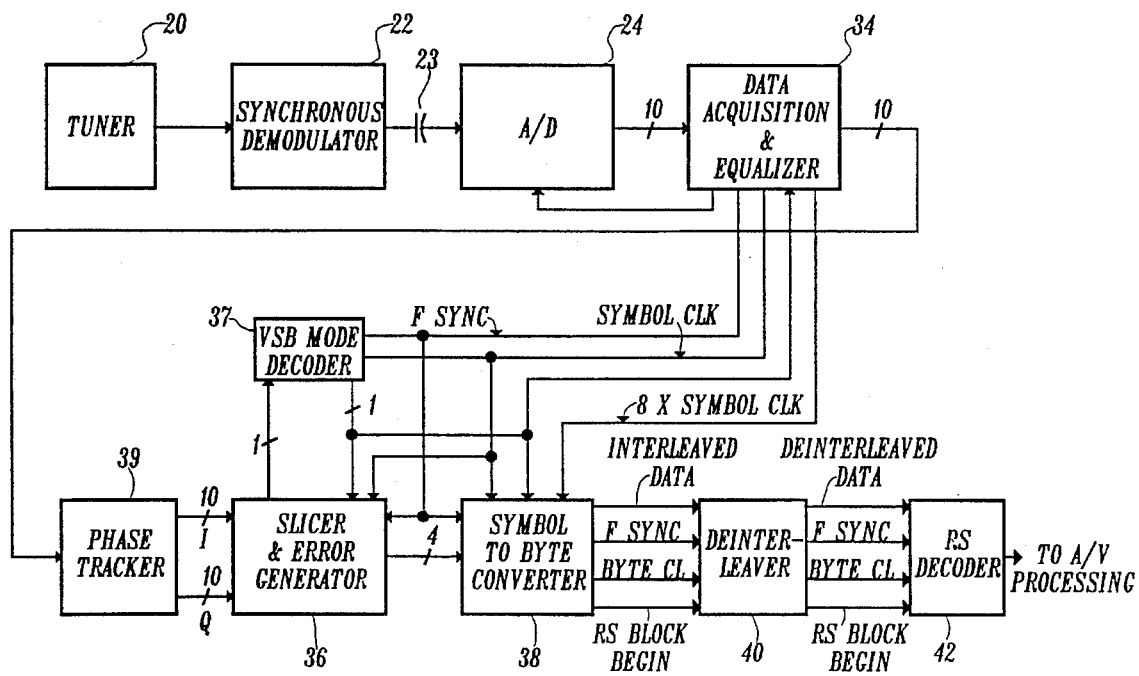
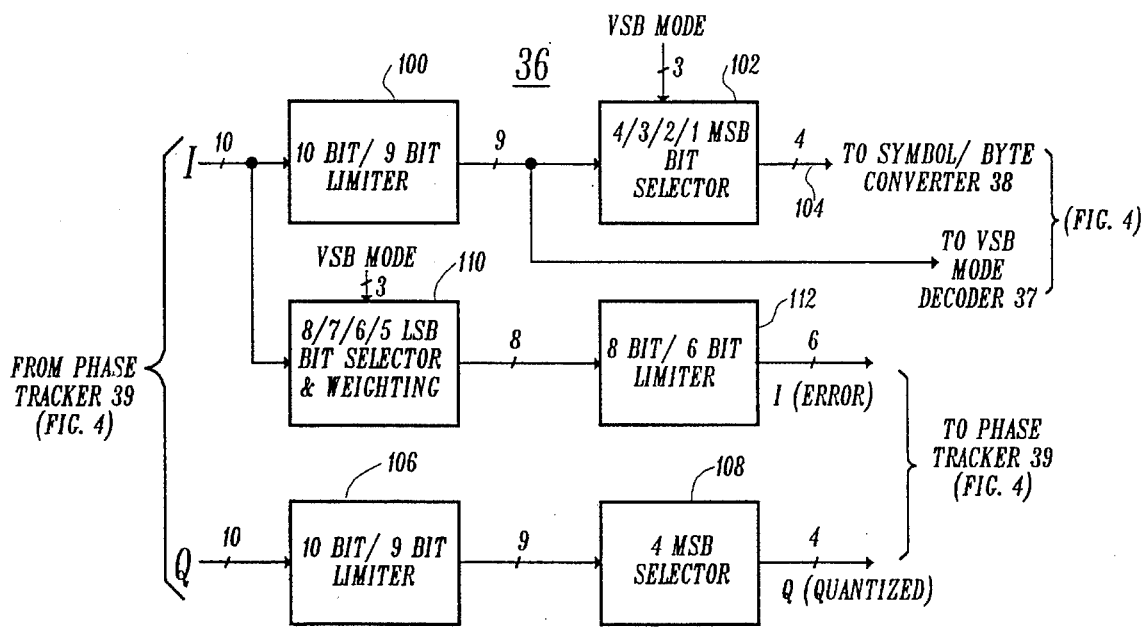
FIG. 5

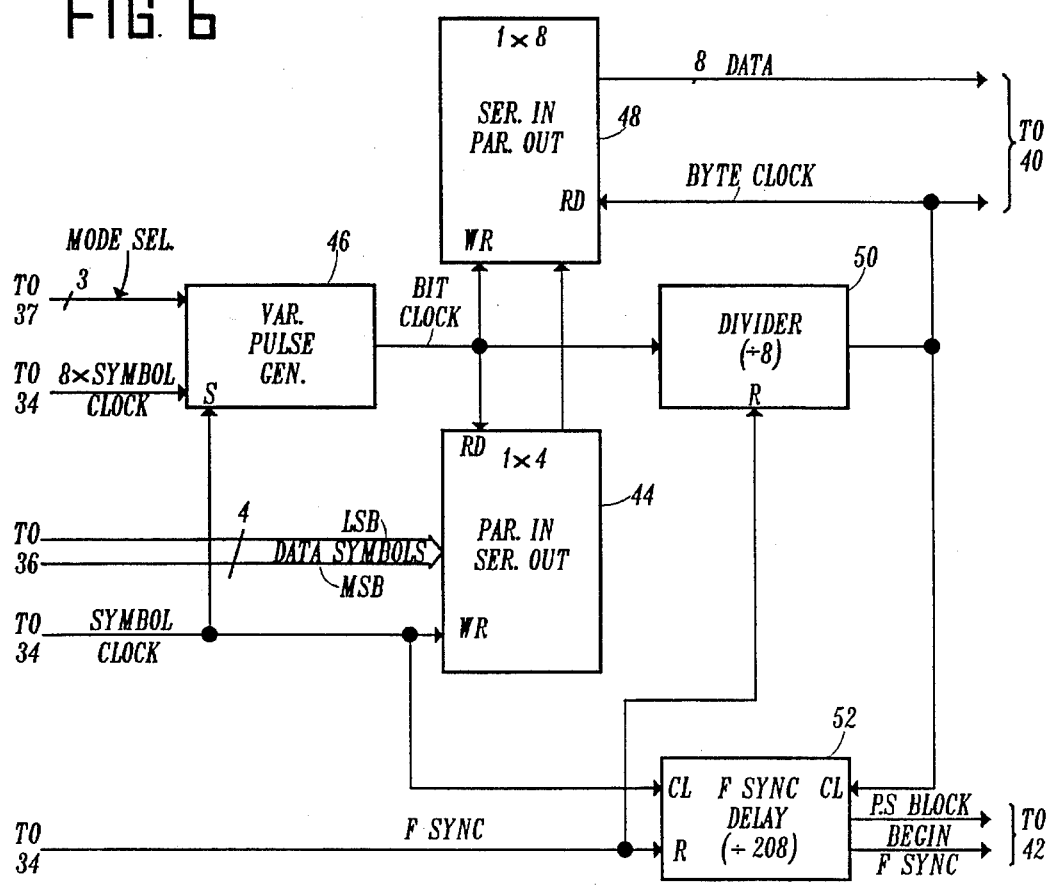

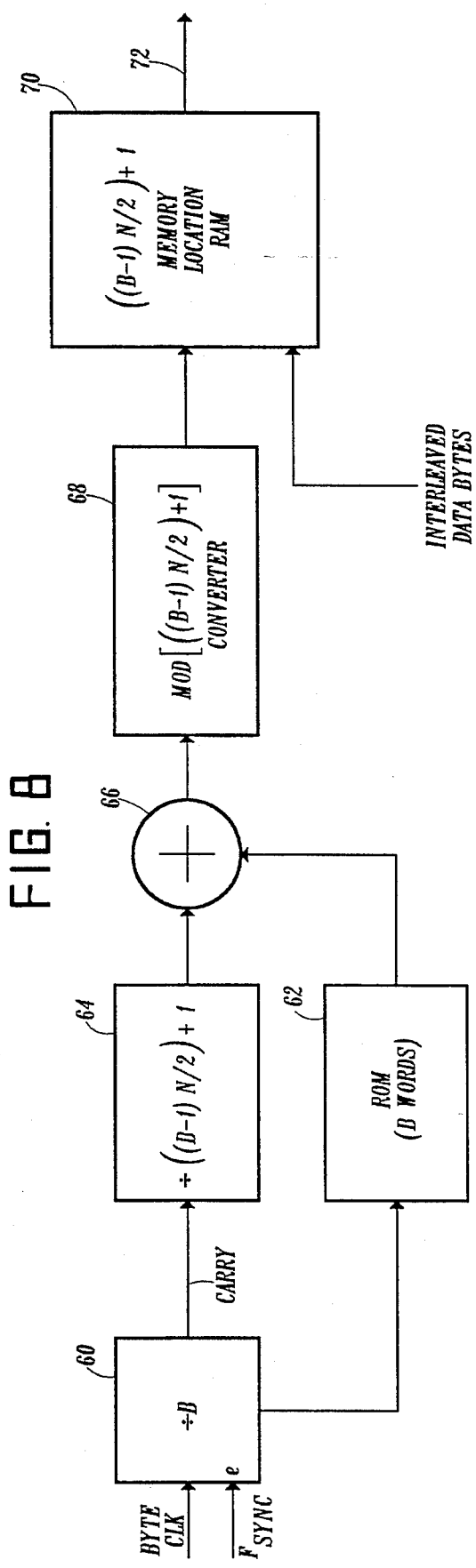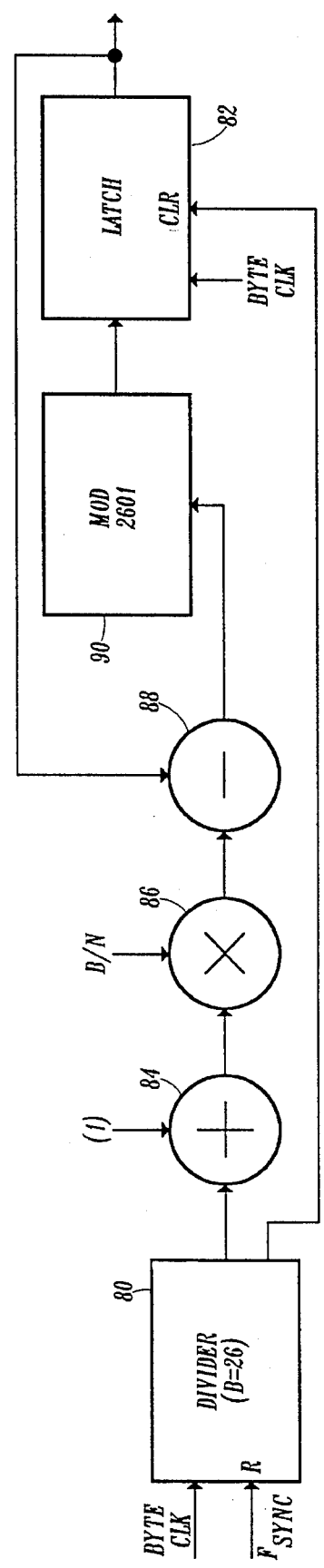

DATA LEVEL SELECTION FOR MULTILEVEL VSB TRANSMISSION SYSTEM

CROSS REFERENCE TO RELATED APPLICATIONS

This application is a continuation-in-part of application Ser. No. 175,061, filed Dec. 29, 1993, entitled DATA FRAME FORMAT FOR VARIABLE SIZE DATA CONSTELLATIONS now abandoned, and applications Ser. No. 014,889, filed Feb. 8, 1993, now U.S. Pat. No. 5,406,587, entitled ERROR TRACKING LOOP, and discloses subject matter claimed in application Ser. No. 175,014, filed Dec. 29, 1993, entitled DIGITAL TRANSMISSION SYSTEM WITH DATA RATE OPTIMIZED FOR NOISE IN TRANSMISSION MEDIUM now U.S. Pat. No. 5,452,009; Ser. No. 175,085, filed Dec. 29, 1993, entitled DATA SYSTEM HAVING 24 LEVEL SYMBOLS; Ser. No. 315,153, filed Sep. 29, 1994, which is a continuation-in-part of Ser. No. 175,325, filed Dec. 29, 1993, entitled CONVOLUTIONAL DEINTERLEAVER (now abandoned); and Ser. No. 175,070, filed Dec. 29, 1993, entitled SYMBOL TO BYTE CONVERTER, all assigned to Zenith Electronics Corporation.

BACKGROUND OF THE INVENTION AND PRIOR ART

This invention relates generally to digital transmission systems and particularly to a digital data transmission system having a data frame structure and circuit arrangement selected to facilitate receiver operations such as symbol to byte conversion, deinterleaving and forward error correction and a data rate that is related to the signal to noise ratio (S/N ratio) of the transmission environment for enhancing system capacity.

U.S. Pat. No. 5,087,975 discloses a vestigial sideband (VSB) system for transmitting a television signal in the form of successive M-level symbols over a standard 6 MHz television channel. The television signal may, for example, comprise one or two compressed wideband HDTV signals or a number of compressed NTSC signals. While the number of levels M characterizing the symbols may vary depending on circumstances, the symbol rate is preferably fixed, such as at a rate of 684 H (about 10.76 Megasymbols/sec), where H is the NTSC horizontal scanning frequency. The number of symbol levels used in any particular situation is largely a function of the S/N ratio characterizing the transmission medium, a smaller number of symbol levels being used in situations where the S/N ratio is low. It is believed that the ability to accommodate symbol levels of 24, 16, 8, 4 and 2 provides adequate flexibility to satisfy conditions in most systems. It will be appreciated that lower values of M can provide improved S/N ratio performance at the expense of reduced transmission bit rate. For example, assuming a rate of 10.76M symbol/sec, a 2-level VSB signal (1 bit per symbol) provides a transmission bit rate of 10.76 Megabits/sec, a 4-level VSB signal (2 bits per symbol) provides a transmission bit rate of 21.52 Megabits/sec and so on up to a 24-level VSB signal which provides a transmission bit rate of about 48.43 Megabits/sec.

It is generally known that the S/N ratio performance of cable television plants decreases as the signal (channel) frequency increases. The foregoing attribute of an M-level VSB transmission system, i.e. improved S/N ratio performance as M decreases, is the invention claimed in copending application Ser. No. 175,014, above, to compensate for the S/N ratio degradation in the higher frequency channels of CATV distribution plants. That is, according to that invention, VSB transmission is effected in a CATV system wherein the lower frequency channels are transmitted using larger values of M and the higher frequency channels are transmitted using lower values of M. While the bit rate of the higher frequency channels is thereby reduced, the received signal may be reproduced with a S/N ratio comparable to that of the lower frequency channels.

Moreover, in accordance with the inventions claimed in others of the above identified copending applications, system efficiency, particularly in relation to receiver operations such as data deinterleaving, symbol to byte conversion and forward error correction, may be greatly enhanced by selecting a data frame structure which facilitates these operations within the constraints of the variable M-level VSB character of the transmitted signal.

OBJECTS OF THE INVENTION

It is a principal object of this invention to provide a novel data level selection system for a multilevel VSB digital data transmission and reception system.

Another object of the invention is to provide a simplified level selection system for transmission and reception of a digital information signal having a variable data constellation.

BRIEF DESCRIPTION OF THE DRAWINGS

These and other objects and advantages of the invention will be apparent upon reading the following description in conjunction with the drawings, in which:

FIG. 1 illustrates the data frame structure used in the invention;

FIG. 2 is a chart showing the relationship of data constellation size to the other parameters of the invention;

FIG. 3 is a simplified block diagram of a transmitter used with the invention;

FIG. 3A is a chart illustrating a portion of the byte to symbol converter and mapper in the transmitter of FIG. 3;

FIG. 3B is a chart illustrating the variation of S/N ratio with frequency in a cable plant and assignment of VSB mode for optimizing cable plant operation;

FIG. 4 is a simplified diagram of a receiver constructed in accordance with the invention;

FIG. 5 is a more detailed showing of the data processor section of the receiver of FIG. 4;

FIG. 6 is a more detailed showing of the symbol to byte converter of the data processor of FIG. 5;

FIG. 7 is a diagram of an exemplary simple linear memory array for deinterleaving a convolutionally interleaved data stream;

FIG. 8 is a generalized circuit for generating the memory addresses for a memory array such as that illustrated in FIG. 7;

FIG. 9 is a memory array of a ROM suitable for use in an actual embodiment of the invention; and FIG. 10 is a replacement circuit for the ROM of FIG. 9.

DESCRIPTION OF THE PREFERRED EMBODIMENT

Figure 4A:
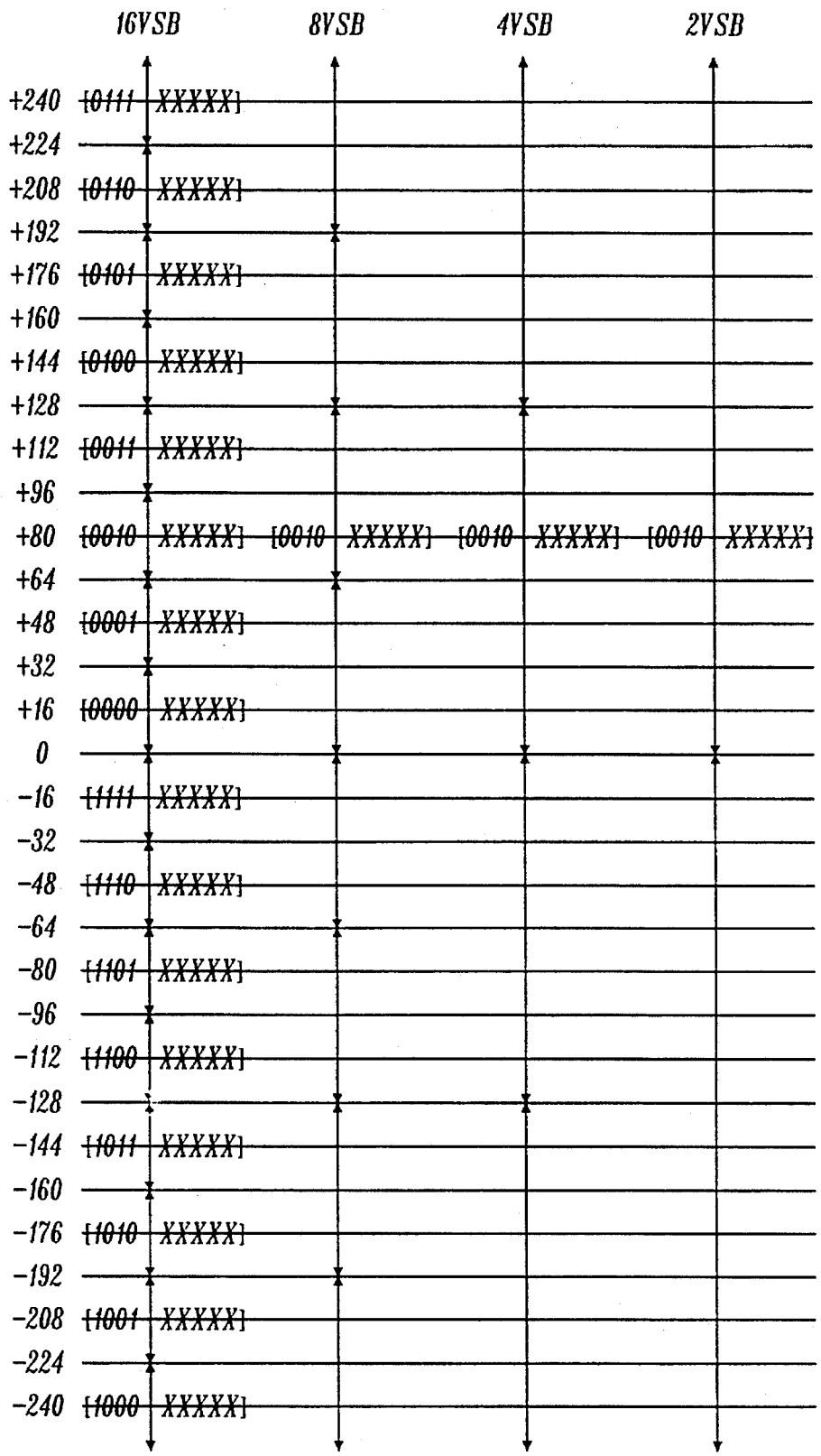
FIG. 4A illustrates the ranges of symbol levels in two's complement form.

The structure of the novel data frame of the invention is illustrated in FIG. 1. The data frame, generally identified by reference numeral 10, comprises 313 data segments (DS) identified as DS0-DS312. Each data segment includes 832 symbols for data and 4 symbols defining a data segment sync character 11. Each data segment sync character 11 comprises four 2-level symbols which preferably assume the form disclosed in copending application Ser. No. 894,388. The first data segment DS0 comprises only 2-level symbols. These 2-level symbols comprise a pseudo random sequence frame synchronization code, and an 8 symbol VSB mode, or control, signal that identifies the level M (e.g. 24, 16, 8, 4 or 2) of the symbols of the data field of the remaining 312 data segments of the data frame. The first three bits of the eight, bit VSB mode control byte identify the VSB mode and the remaining 5 bits comprise parity bits which may be used by the receiver for error detection. In the previously mentioned CATV distribution system claimed in Ser. No. 175,014, for example, the VSB mode signal would identify a relatively large M for low frequency channels and a smaller M for higher frequency channels. In a terrestrial broadcast environment, the VSB mode would most likely be M=2, 4 or 8.

Referring to the table of FIG. 2, each data symbol of a data segment DS1-DS312 represents either 4.5 bits (M=24), 4 bits (M=16), 3 bits (M=8), 2 bits (M=4), or 1 bit (M=2). Since there are a fixed number of data symbols per frame (312×832= 259,584), the number of data bytes per frame will vary as shown. That is, each frame comprises 146,016 data bytes for VSB mode M=24; 129,792 data bytes for VSB mode M=16; 97,344 data bytes for VSB mode M=8; 64,896 data bytes for VSB mode M=4; and 32,448 data bytes for VSB mode M=2. However, while the number of data bytes per frame varies depending on the VSB mode M, it will be observed that for any particular value of M (24, 16, 8, 4 or 2), an integral number of bytes is provided in each frame. This characteristic of the structure of frame 10 substantially simplifies the design of a receiver such that frame synchronization will be effected at a rate corresponding to an integral number of data bytes regardless of the VSB mode (i.e. 24, 16, 8, 4 or 2 level symbols). As will be explained in further detail hereinafter, the receiver forward error correction circuitry, the receiver symbol to byte converter, and the receiver deinterleaver are preferably frame synchronized with the transmitted signal. The frame sync signal can be directly used for these purposes so long as there are an integral number of bytes, forward error correction blocks and interleave blocks in each data frame for each of the VSB modes.

Reed-Solomon (RS) forward error correction is used in the receiver incorporating the invention. A standard transport packet size of 188 bytes has been established by the MPEG (Motion Picture Experts Group) committee. Adding 20 parity bytes to each such transport packet results in an RS block size of 208 data bytes, allowing for the correction of 10 byte errors per RS block. As seen in FIG. 2, an RS block size of 208 bytes advantageously results in an integral number of RS blocks per frame for all of the selected VSB modes, thereby allowing the receiver RS decoder to be synchronized by the frame sync signal. An interleave block (I block) is defined according to the invention as comprising 26 RS blocks (5,408 data bytes) which also results in an integral number of I blocks per frame regardless of the selected VSB mode (see FIG. 2), thereby also allowing the frame sync signal to be used to periodically synchronize the receiver deinterleaver in the case where a block interleave algorithm is employed (data stored in row format and read out in column format). For convolutional interleaving, the size of a parameter B (to be defined hereinafter) must be selected such that each frame (regardless of VSB mode) comprises an integral number of B data bytes, thereby allowing for frame synchronization. In the described embodiment of the invention B=26 data bytes. Also, the use of an integral number of data bytes per frame, regardless of VSB mode, enables direct frame synchronization of the receiver symbol to byte converter.

FIG. 3 is a simplified block diagram of a transmitter constructed in accordance with the invention. A source 12 of television signals (or some other source of digital data) is coupled to a convolutional interleaver 13 which, in turn, supplies interleaved data bytes to a byte to symbol converter and mapper 14. It will be appreciated that signal source 12 may comprise a compressed HDTV signal (or two compressed HDTV signals depending on the VSB mode) or a number of compressed NTSC signals. The symbol output of converter (and mapper) 14 is supplied to a frame formatter 15 that has inputs of data, data segment sync and frame sync and is controlled, along with converter 14, by a VSB mode control signal. The formatted frames, which conform to the arrangement previously described in connection with FIGS. 1 and 2, are supplied to a digital to analog (D/A) converter 16 and thence to a VSB transmitter 17 for transmission over a 6 MHz television channel. The transmission medium may comprise, for example, a cable television plant or a terrestrial broadcast environment. In either case, one such transmitter is required for each transmitted 6 MHz channel.

FIG. 3A is a chart illustrating a method of implementing the byte to symbol converter and mapper 14. The chart comprises four columns, one for each of the VSB modes M=16, M=8, M=4 and M=2. Converter 14 is operative in response to the applied VSB mode control signal for using the identified column of the chart of FIG. 3A for converting the input data bytes to output data symbols. The chart illustrates how the data bytes from interleaver 13 are mapped to multi-bit (e.g. 10-bit) symbols by converter 14 for VSB modes M=16, 8, 4 and 2. As shown, for VSB mode M=16, each group of four (4) successive data bits of an input data byte (0000-1111) is mapped to a corresponding one of sixteen 10-bit symbols having levels in a range between −240 and +240 (decimal equivalents). For VSB mode M=8, each group of three (3) successive data bits (000-111) is mapped to a corresponding one of eight 10-bit symbols having levels in a range between −224 and +224 (decimal equivalents) and for VSB mode M=4 each group of two (2) successive data bits (00-11) is mapped to a corresponding one of four 10-bit symbols having levels in a range between −192 and +192. Finally, in VSB mode M=2 each data bit (0-1) is mapped to one of two 10-bit symbols of level −128 or +128. In connection with the foregoing, it will be observed that the slice points (i.e. the values half-way between adjacent symbol levels) shown in dotted line for all four data constellations are coincident with selected slice points for VSB mode M=16 and that the symbol levels of each VSB mode are coincident with the slice points of all higher order (i.e. more densely packed) data constellations. As will be explained in more detail hereinafter, these characteristics of the data constellations together with the selected symbol levels greatly facilitates reconversion of the received symbols back into data bits.

For example, for VSB mode M=16, the input data byte 11010101 would be converted to two successive data symbols having relative amplitudes of +176 and −80. For VSB mode M=8, the input data byte would be converted to three successive data symbols having relative amplitudes of +160, +96 and −32 (assuming the first bit of the next data byte is 1) or +160, +96 and −96 (assuming the first bit of the next data byte is 0). For VSB mode M=4, the data byte would be converted to four successive symbols having relative amplitudes of +192, −64, −64 and −64. Finally, for VSB mode M=2, eight output symbols would be provided at relative amplitudes +128, +128, −128, +128, −128, +128, −128 and +128. In the case of VSB mode M=24, converter and mapper 14 includes appropriate memory and look-up tables for mapping successive groups of 9 input data bits into two successive 24 level output symbols. In this way each symbol can be referred to as representing 4.5 bits (i.e. 9 bits/2 symbols). This specific implementation is claimed in copending application Ser. No. 175,085, above, and will not be discussed in detail further herein.

As mentioned, the relative levels of the symbols of each VSB mode are evenly spaced and lie midway between the relative levels of selected symbols of all higher VSB modes. For example, relative level +224 of VSB mode M=8 lies midway between relative levels +240 and +208 of VSB mode M=16, relative level +192 of VSB mode M=4 lies midway between relative levels +224 and +160 of VSB mode M=8 and midway between relative levels +208 and +176 of VSB mode M=16, relative level +128 of VSB mode M=2 lies midway between relative levels +192 and +64 of VSB mode M=4, +160 and +96 of VSB mode M=8 and +144 and +112 of VSB mode M=16, and so on. Preferably the mapped 10-bit symbols are offset by a relatively small DC value from the values shown by a predetermined amount (e.g. +40) prior to transmission to provide a small pilot for facilitating carrier acquisition in the receiver. The offset 10-bit symbols are then applied through frame formatter 15 to D/A 16 where they are converted to analog form for transmission by VSB transmitter 17. Also, it will be observed that the data rate characterizing each VSB mode increases by one bit per symbol relative to the data rate of the immediately lower VSB mode while its S/N ratio performance is reduced by one-half. It will be appreciated that the numerical values of the various levels is a matter of design choice and is not limiting of the invention.

The above represents the situation in the cable version of the invention presently being implemented in chip form, in which 16 VSB is the highest mode. However, it will be apparent to those skilled in the art that the 24 VSB mode implementation will require different relative levels. The technique and apparatus for processing a 24 VSB mode signal are discussed below and claimed in copending application Ser. No. 175,085, above.

FIG. 3B illustrates the general S/N ratio fall off of a cable plant with increasing frequency. As is specified in the invention, the higher S/N ratio transmission characteristics for lower frequency television signals can be used to advantageously employ higher mode VSB transmissions (and a higher data rate) for similar performance. The "noisier" portion of the spectrum (low S/N ratio) may be used for signals of lower VSB modes. It will be apparent that this technique optimizes the utilization of the cable plant and is claimed in copending application Ser. No. 175,014, above.

FIG. 4 is a simplified partial block diagram of a receiver constructed according to the invention. The received RF television signal from the transmitter of FIG. 3 comprises an M-level VSB signal having the frame format of FIG. 1. The received signal is converted to an IF frequency by a tuner 20 and applied to a synchronous demodulator 22 which generates an analog baseband output signal comprising the M-level symbols at a rate of about 10.76 Megasymbols/sec. The DC component (i.e. pilot) of the demodulated analog signal is largely removed by a capacitor 23 before it is applied to an A/D 24. A/D 24 may comprise a 10-bit A/D or, alternatively, an 8 or 9-bit A/D may be used to reduce cost.

In the latter event, A/D 24 would nevertheless provide a 10-bit output (although with 8 or 9-bit resolution) with the two LSB's (least significant bits) grounded (8-bit A/D) or the LSB grounded (9-bit A/D). The 10-bit sampled symbols produced by A/D 24 are equalized by a data acquisition circuit and channel equalizer 34 and applied therefrom to a phase tracking loop 39. Phase tracking loop 39, which is disclosed in more detail in application Ser. No. 014,889, above, corrects the received symbols for certain phase and amplitude distortions and provides the corrected 10-bit symbols as an in-phase (I) output signal. Phase tracking loop 39 also provides the related 10-bit quadrature (Q) output signal. The I and Q outputs of phase tracking loop 39 are applied to a slicer and error signal generator circuit 36. Circuit 36, which is shown in more detail in FIG. 5, is responsive to a 3-bit VSB mode select signal from a VSB mode decoder 37 for reconverting the 10-bit symbols into the corresponding data bits (4, 3, 2 or 1 data bits for VSB modes M=16, 8, 4 and 2, respectively) for application over a four (4) line bus to a symbol-to-byte converter 38.

As shown in FIG. 5, the I-channel 10-bit symbols from phase tracking circuit 39 are initially applied to a 10-bit/9-bit limiter 100 for providing a 9-bit output, in two's complement form, corresponding to the range of symbol levels shown in FIG. 4A. This 9-bit signal is illustrated in FIG. 4A for each of the four VSB modes. It will be observed that the four most significant bits (MSB's) of each 9-bit symbol, with the MSB inverted, represent, for VSB mode M=16, the four data bits corresponding to the respective symbol. For example, for VSB mode M=16, all 9-bit symbols between values +96 and +127 have the form 0011xxxxx, where xxxxx has a minimum value of 00000 at level +96 and a maximum value of 11111 at level +127. The four MSB's (with the MSB inverted) of the 9-bit symbols having values within this range will therefore all have the value 1011.

Referring back to FIG. 3A, it will be seen that values within the range +96 to +127 are nearest symbol level +112 which represents data bits 1011. The four MSB's (0011) of all the 9-bit symbols within the range +96 and +127 therefore represent the correct corresponding 4-bit data pattern (with the MSB inverted). It can be seen that the four MSB's of each of the other 9-bit symbols likewise represent the correct 4-bit data code of the respective symbol (with the MSB inverted).

For VSB mode M=8, the three MSB's of each 9-bit symbol similarly represent the correct three data bits of the respective symbol (with the MSB inverted). For example, the three MSB's of all the 9-bit symbols within the range +64 to +127 comprise 001 which represent (with the MSB inverted) the correct data bits 101 for the symbols within this range. Similarly, for VSB modes M=4 and M=2, the two and one MSB's, respectively (with the MSB inverted) of each 9-bit symbol represent the correct two or one data bits of the respective symbol.

The foregoing relationship between the MSB's of the 9-bit symbols and the corresponding 4/3/2/1 data bits represented by each respective symbol, facilitates the use of relatively simple techniques for converting each 9-bit symbol to the corresponding 4/3/2/1 data bits. This is in contrast to the prior art use of relatively complex slicers to perform this function by effecting multiple comparisons of each 9-bit symbol with a plurality of known slice points.

Accordingly, referring back to FIG. 5, the four MSB's of each 9-bit symbol provided by limiter 100 are applied to a 4/3/2/1 bit selector 102. Bit selector 102 is responsive to the VSB mode signal for coupling all four MSB's (for VSB mode M=16), the first three MSB's (for VSB mode M=8), the first two MSB's (for VSB mode M=4) or the first MSB (for VSB mode M=2)—in each case with the MSB inverted—to an output 4-line data bus 104. It will be appreciated that the outputs on bus 104 represent the proper data bits for each 9-bit symbol provided by limiter 100. Also, since the VSB mode signal is encoded as a series of 2-level symbols in data segment DS0 of each data frame, the MSB of each 9-bit symbol is applied to VSB mode detector 37 to allow for decoding thereof.

Phase tracking circuit 39 (see application Ser. No. 08/04,889) comprises a complex multiplier for applying a phase correction to the complex signal comprising the 10-bit I-channel signal from equalizer 34 and the related Q-channel signal "estimated" therefrom. The amount of phase correction is based on the errors characterizing the I-channel and estimated Q-channel signals. In the immediately referenced application, such errors are derived using look-up tables wherein the I-channel error signal, which may be appropriately weighted, represents the difference between the levels of the received I-channel signal and the closest respective valid levels thereof and the Q-channel quantized signal represents the one of 16 regions dividing the Q-axis of the complex plane in which the IQ vector terminates.

According to the present invention, the foregoing look-up tables are replaced with the much simplified circuitry shown in FIG. 5. In particular, the Q-channel quantized signal is derived by initially applying the estimated 10-bit Q signal developed by phase tracking circuit 39 to a 10-bit/9-bit limiter 106 and then selecting the four MSB's of the limited signal in a bit selector 108. It will be appreciated that the four MSB's of the estimated and limited Q-signal represent the one-of-sixteen regions dividing the Q-axis in which the complex IQ signal terminates. The I-channel error signal is derived by applying the 10-bit I signal developed by phase tracking circuit 39 to a bit selector and weighting circuit 110. Referring to FIG. 4A, it will be seen that for VSB mode M=16 the five LSB's of each symbol (with the MSB inverted) represent the difference between the respective symbol and the closest valid level thereof. The five LSB's of each symbol are therefore provided by selector 110 (with the MSB inverted) as a measure of the I-channel error signal (after appropriate weighting). The I-channel error signal is developed in a like manner for VSB modes M=8, 4 and 2 except that the six, seven and eight LSB's of each symbol, respectively, are selected by selector 110 as a measure of the error for the different VSB modes. This error signal is limited to a 6-bit value in a limiter 112 to form the I-channel error signal.

As mentioned, the binary symbols from A/D 24 are applied to a data acquisition circuit 34 which performs a number of functions including generating the feedback signal for controlling A/D 24, generating a symbol clock signal, generating a frame sync (FSYNC) signal and generating an 8 times symbol clock signal. The symbol clock signal has a frequency of about 10.76 MHz for all VSB modes (except VSB mode M=24 for which its frequency is reduced by one-half to about 5.38 MHz). The FSYNC is approximately 41 Hz. The frame synchronization code of data segment DS0 enables derivation of the FSYNC signal which coincides in time with the first data symbol of data segment DS1 of each data frame 10.

As mentioned above, slicer 36 couples the sliced values of the VSB mode control byte of data segment DS0 of each frame to VSB mode decoder 37, which detects the three bits of the mode control byte and develops a 3-bit VSB mode select signal. This signal identifies the VSB mode (M=16, 8, 4 or 2) of the received symbols for controlling data acquisition circuit 34, slicer 36 and symbol to byte converter 38 during the remainder of the respective frame. The remaining bits of the mode control byte are used for error detection by VSB mode decoder 37. Slicer 36, which includes a four line output bus, is responsive to the VSB mode select signal for converting the 10-bit symbol amplitudes to their corresponding data bits as described above. Thus, as previously explained, in the M=2 VSB mode, each 10-bit symbol amplitude signal is converted to the corresponding 1-bit data signal on one of the four output lines, to the corresponding 2-bit data signal on two of the output lines in the M=4 VSB mode, to the corresponding 3-bit data signal on three of the output lines in the M=8 VSB mode and to the corresponding 4-bit data signal on four of the output lines in the M=16 VSB mode.

The four-line output of slicer 36, together with the VSB mode select signal from decoder 37 and the timing signals from data acquisition circuit 34 are coupled to symbol to byte converter 38, the output of which supplies a deinterleaver 40 that, in turn, supplies an RS decoder 42. Symbol to byte converter 38, which is claimed in copending application Ser. No. 175,070, above, converts the input bits representing the received symbols into a series of 8-bit data bytes for each of the VSB modes. Deinterleaver 40 deinterleaves the convolutionally interleaved data bytes supplied by converter 38 and RS decoder 42 performs error correction on the deinterleaved data bytes.

Symbol to byte converter 38 is shown in more detail in FIG. 6. The 4-line data symbol bus from slicer 36 and the symbol clock signal from data acquisition circuit 34 are applied to a 1×4 parallel-in, serial-out register 44. The VSB mode signal, the symbol clock signal and the 8 times symbol clock signal are applied to the inputs of a variable pulse generator 46. Generator 46 produces a series of pulses (bit clocks) at the 8 times symbol clock rate in response to each received symbol clock, the series including one pulse for VSB mode M=2, two pulses for VSB mode M=4, 3 pulses for VSB mode M=8, and 4 pulses for VSB mode M=16.

Assuming, for example, VSB mode M=8, the 3 bits from slicer 36 (representing a received symbol) are simultaneously written into the top three locations of register 44 in response to a symbol clock. At the same time, the symbol clock starts pulse generator 46 which produces 3 bit clocks (at 8 times the symbol clock rate) which are applied to the Read (RD) input of register 44, to the Write (WR) input of a 1×8 Serial-in, Parallel-out register 48 and to the input of a divide-by-eight circuit divider 50. Divider 50 is reset at the beginning of each data frame 10 by FSYNC for synchronizing converter 38 with the received data, since FSYNC always represents a byte boundary. The 3 bits previously loaded into register 44 are serially read out of register 44 in response to the 3 bit clock pulses and written into register 48. The next 3-bit symbol from slicer 36 is processed in the same manner, resulting in 6 bits being stored in register 48. After the first two bits of the next (i.e. third) 3-bit symbol are written into register 48 from register 44, divider 50 generates an output (Byte Clock) causing the accumulated 8-bit data byte stored in register 48 to be read out (in parallel). The remaining single bit of the third symbol is stored in register 48 and read out with the next 7 bits of the succeeding 3-bit symbol as the next data byte. In this manner, converter 38 arranges the input 3-bit symbols (for M=8) into a series of successive 8-bit output data bytes, which are supplied to deinterleaver 40 at the rate of the byte clock.

A substantially similar procedure is carried out for VSB modes M=2, 4 and 16 except that, depending on the VSB mode, it will take a longer or shorter time period to compose the data bytes. For example, in VSB modes M=2 and 4, the bit clock generated by pulse generator 46 in response to each symbol clock signal comprises one and two pulses respectively, so that 8 and 4 symbol clock signals are required to produce the respective data bytes (versus 2⅔ for VSB mode M=8).

Converter 38 further includes a divider 52 which is also reset by FSYNC to synchronize its operation with the beginning of each data frame 10. In particular, divider 52 is a divide-by-208 counter which is clocked by the Byte Clock generated by divider 50 to generate a Begin RS Block signal for identifying the beginning of each block of 208 data bytes synchronously with the first data byte of each data frame. As will be explained hereinafter, this signal is used to synchronize the operation of RS decoder 42. Divider 52 includes means responsive to the symbol and byte clocks for converting the one-symbol-wide input FSYNC to a one byte wide output FSYNC.

As described earlier, the outputs of converter 38 are applied to deinterleaver 40. As will be explained in further detail hereinafter, deinterleaver 40 deinterleaves the convolutionally interleaved data bytes received from converter 38 using a minimum of memory.

As is well known, interleaving is done at the transmitter (see interleaver 13 of FIG. 3) to spread contiguous data bytes apart from each other to help immunize the transmitted data from burst noise. In the receiver, the interleaved bytes must be deinterleaved to re-establish their original relationship prior to forward error correction. Thus, burst noise of some given time duration will corrupt only a limited number of bytes within an RS block of the deinterleaved data, which corrupted bytes can be corrected by the RS decoder. The interleaving algorithm used is selected in anticipation of the maximum expected burst noise duration at the fastest byte clock rate to insure that the RS decoder is capable of error correcting the corrupted deinterleaved data bytes. Thus, as maximum expected burst noise duration increases, the interleaving algorithm must spread contiguous data bytes farther apart. Alternatively, a more powerful RS code may be used, but this approach has the disadvantage of using more overhead, i.e. requiring more bytes for error correction. Also, by referencing the system to the highest byte clock rate, increased burst error protection will be provided as the VSB mode and the corresponding byte rate decrease, because the interleave pattern is effected over a given number of bytes regardless of VSB mode.

Convolutional interleave algorithms are commonly used to immunize transmitted data from burst noise. Such algorithms delay the individual bytes of successive groups of bytes by different amounts to effectively scatter the bytes over a portion or all of the data frame. Deinterleaving is effected by delaying the received bytes by opposite amounts. In implementing such a system, three parameters are of particular significance; the maximum expected burst length BL, the number of byte errors T which the RS decoder can correct and the RS block size N. As mentioned previously, there preferably are an integral number of RS blocks in the data frame so that the RS decoder can be synchronized by the frame sync signal FSYNC. By selecting an interleave block size (of which there are preferably an integral number in each frame) equal to a parameter B=BL/T and the different delays as integral multiples of the RS block size N, the RS decoder will be able to correct the deinterleaved data for burst noise up to the maximum expected duration of BL byte clocks.

Consider the simplified example of a system in which the maximum expected burst length is 4 data byte clocks and the RS decoder is capable of correcting one data byte error in each 8 data byte RS block (i.e. BL=4, T=1, N=8). Using these parameters, the interleave block size B=BL/T=4/1=4. Convolutional interleaving is performed using these parameters such that, for each group of B=4 data bytes, the first data byte is exposed to a delay of 0, the second to a delay of 1N=8 data byte clocks, the third to a delay of 2N=16 data byte clocks and the fourth to a delay of 3N=24 data byte clocks. Deinterleaving is effected by reversing the delays such that for each group of B=4 received interleaved data bytes, the first is delayed by 3N=24 data byte clocks, the second by 2N=16 data byte clocks, the third by 1N=8 data byte clocks and the fourth by 0.

Conventional convolutional deinterleavers implementing the above algorithm comprise a memory having (B−1)N/2 memory locations. For realistic values of B and N, which are typically much larger than the values used in the simplified example given above, this leads to an impractical architecture because of the large number of shift registers required. An alternate architecture which may be employed uses a standard linear memory array for which a large number of fifo head and tail pointers must be maintained in hardware. This is a very complex task and thus highly undesirable.

These problems are solved by using a linear memory array with an address generator for generating a repeating sequence of read-write addresses that results in correctly deinterleaving the received data. The memory array is of a relatively small size utilizing only one memory location in excess of the number required to impose the different delays on the respective data bytes of each group. This is described below in relation to the simplified example given above and is extended to an implementation using more realistic parameters. This aspect of the invention is separately claimed in copending application Ser. No. 315,153, above.

A linear memory array having [((B−1)N/2)+1] memory locations may be addressed by a particular sequence of read-write addresses to correctly deinterleave a convolutionally interleaved data stream. The sequence of addresses is developed by first writing a column of [((B−1)N/2)+1] consecutive integers beginning with 0. This is represented by the first column of the addressing matrix of FIG. 7, which is for the simplified example with B=4 and N=8. Next, a second column that is the same as the first is written except that it is rotated down by (B−1)N/B=(3×2)=6 rows. This is the second column in the matrix of FIG. 7. The third column is developed by rotating the second column down by (B−2)N/B=(2×2)=4 rows and, finally, the fourth and last column is developed by rotating the third column down by (B−3)N/B=(1×2)=2 rows. This matrix has a size of B=4 columns and [((B−1)N/2)+1]=13 rows, the number of rows being the required size of the deinterleave linear memory array. If the numbers in the matrix are read out a row at a time, they can be used as read-write addresses for application to the deinterleave memory to continuously deinterleave the received data, i.e. read out the old data at the addressed memory location and write in the new data at the same location.

A circuit for generating the address matrix of FIG. 7 is illustrated in FIG. 8. A divide by B counter 60, which is reset by FSYNC, is responsive to the byte clock from converter 38 for applying a repeating sequence of counts from a minimum number to a maximum number, e.g. from 0 to (B−1), for addressing a B word ROM 62 at the byte clock rate. ROM 62 stores the B words comprising the first row of the address matrix. The carry output of divider 60 is used to clock a second divider 64 at the slower rate of byte clock/B, the division ratio of divider 64 being ((B−1)N/2)+1. The outputs of divider 64 and ROM 62 are summed in an adder 66 and applied through a modulo [((B−1)N/2)+1] converter for addressing a linear deinterleave memory array 70 having ((B−1)N/2)+1 memory locations. Converter 68 preferably comprises a circuit which either couples its input signal to its output or, if the input is greater than ((B−1)N/2)+1, subtracts this value from the input signal before coupling it to its output.

For the simplified example described above, i.e. B=4 and N=8, divider 60 (÷4) repetitively generates the output count sequence 0, 1, 2, 3 for addressing and reading the four words 0, 7, 3, 1 stored in ROM 62 at the byte clock rate. Divider 64 (÷13) repetitively generates the output sequence 0, 1, 2 . . . 12 at ¼ the byte clock rate. Consequently, for each group of 4 successive byte clocks, the four words 0, 7, 3, 1 read from ROM 62 are each added to the output of divider 64 in adder 66 to produce, after processing by modulo 13 converter 68, a row of the address matrix of FIG. 7. For example, the first row 0, 7, 3, 1 of the matrix is produced during the first four byte clocks wherein 0 (from divider 64) is added to the outputs 0, 7, 3, 1 of ROM 62. During the next 4 byte clocks the value 1 (from divider 64) is added to the words 0, 7, 3, 1 generated by ROM 62 to produce the second row 1, 8, 4, 2 of the address matrix and so on until finally the last row is generated by adding 12 to each of the 4 words 0, 7, 3, 1 to produce the last row 12, 6 (=19 modulo 13), 2 (=15 modulo 13), 0 (=0 modulo 13).

Each address signal generated at the output of modulo 13 converter 68 initiates a read-write operation of RAM 70. That is, each address first causes the data byte stored at the addressed memory location to be read out on bus 72 and then the new interleaved data byte to be written into the same memory location. By following the addressing scheme disclosed herein, the data bytes read from RAM 70 will be in the correct deinterleaved format. The fact that the input data bytes are correctly deinterleaved can be seen from a close examination of the matrix of FIG. 7. In particular, it will be recalled that convolutional interleaving is effected for each group of four data bytes by delaying the first data byte by 0, the second data byte by 8 byte clocks, the third data byte by 16 byte clocks and the fourth data byte by 24 byte clocks. Theoretically, deinterleaving is then effected by delaying the first received data byte by 24 byte clocks, the second received data byte by 16 byte clocks, the third received data byte by 8 byte clocks and the fourth received data byte by 0 byte clocks. Adding a one byte clock delay to each received data byte will not affect the deinterleaving process so that delays of 25, 17, 9, 1 data clocks are equivalent to using deinterleaving delays of 24, 16, 8, 0 data clocks. Referring to the matrix of FIG. 7, the first received data byte is written into memory location 0 of RAM 70 and read out 25 byte clocks later at column 2, row 7 (i.e. after a delay of 25 byte clocks), the second is written into memory location 7 and read out 17 byte clocks later at column 3, row 5, (i.e. after a delay of 17 byte clocks), the third is written into memory location 3 and read out 9 byte clocks later at column 4, row 3 (i.e. after a delay of 9 byte clocks) and the fourth is written into memory location 1 from which it is read out 1 byte clock later at column 1, row 2 (i.e. after a delay of 1 byte clock). It will be apparent from this analysis that the deinterleaving algorithm is correctly executed.

In an embodiment of the invention actually being constructed, BL=260 bytes, T=10 and N=208. Therefore, B=BL/T=26 bytes, which is integrally related to the frame size for all VSB modes. In the circuit of FIG. 8, divider 60 is a divide-by-26 divider (periodically reset by FSYNC) which sequentially address the 26 words of ROM 62 comprising the first row of the address matrix (0, 2401, . . . 1) shown in FIG. 9. Divider 64 is a divide by 2601 divider and converter 68 is a modulo 2601 converter. Operation of this embodiment of the circuit is identical to that described for the simplified example.

It will be noted that the circuit of FIG. 8 automatically adapts to the different received VSB modes. The circuit simply operates at an increased or decreased rate in response to the byte clock as the VSB mode varies. The deinterleaved data on bus 72, together with the FSYNC and Begin RS Block signals from converter 38 are applied to RS decoder 42 which error corrects the deinterleaved data bytes. Operation of RS decoder 42 is facilitated by synchronization with FSYNC at the beginning of each data frame and by providing an integral number of RS blocks each frame regardless of the VSB mode as previously explained.

FIG. 10 shows a circuit which may be used in place of ROM 62 of FIG. 8 to generate the first row of matrix addresses. The circuit implements the following equations for generating the first row of addresses C (X):

C (0)=0

C (X)=[C (X−1)−(B−X) N/B] mod [(B−1)N/2+1], where X=1, . . . (B−1).

For the simplified example (i.e. B=4 and N=8) the term C(X) becomes C(X)=[C(X−1)−(4−X)2] mod 13. Thus, for example, if X=1, C(X)=(0−6) mod 13=−6 mod 13=7. Similarly, for X=2, C(X)=(7−4) mod 13=3. And finally, for X=3, C(X)=(3−2) mod 13=1. The first row for the larger matrix may likewise be derived using these relationships. The circuit comprises an input divide by B count down divider 80 which is reset by FSYNC and clocked by the byte clock. In response to being reset, an output of divider 80 clears a latch 82. The output of divider 80 is provided in reverse order (B−1, B−2, . . . 0) so that when it is incremented by one (1) in an adder 84, the result is (B−X). The variable (B−X) is multiplied by N/B in a multiplier 86 to provide the expression (B−X)N/B. This is subtracted from the output C(X−1) of latch 82 in subtractor 88 to provide C(X−1)−(B−X)N/B. Finally, the output of the subtractor is coupled by a modulo [((B−1)N/2)+1] circuit for temporary storage in latch 82 in response to a byte clock.

The claims are directed to the invention of data level selection for the multilevel VSB transmission. It will be appreciated that this invention is to be limited only as defined in the claims.

What is claimed is:

1. A digital data processor comprising:

means for developing an information signal comprising a plurality of regularly spaced multilevel symbols, each of said symbols representing a predetermined number of data bits;

means converting each of said symbols into a corresponding multi-bit value; and means for selecting a number of the most significant bits of each of said multi-bit values corresponding to said predetermined number for providing the data bits represented by the respective symbol.

2. The data processor of claim 1 wherein said means for selecting comprises means for inverting the most significant bit of each of said selected number of bits for providing the data bits represented by the respective symbol.

3. The data processor of claim 1 wherein said predetermined number comprises a variable integer.

4. The data processor of claim 3 wherein said predetermined number comprises at least one of the integers 4, 3, 2 or 1.

5. The data processor of claim 2 wherein said multi-bit values comprises at least 9-bit values.

6. A digital data processor comprising:

means for developing an information signal comprising a plurality of regularly spaced multilevel symbols, each of said symbols representing at least one of the integers 4, 3, 2 or 1 data bits;

means for converting each of said symbols into a corresponding multi-bit value; and means for selecting a number of the most significant bits of each of said multi-bit values equal to the associated one of said integers and for inverting the most significant bit of each of said selected number of bits for providing the data bits represented by the respective symbol.

7. The data processor of claim 6 wherein said multi-bit values comprises at least 9-bit values.

8. A method of converting a multi-bit data signal into a plurality of transmission symbols comprising:

defining a family of data constellations each having a different packing density within a given range of values and wherein slice points and data levels of each of said data constellations are coincident with selected slice points of the next more densely packed one of said data constellations;

providing a multi-bit data signal; and using a selected one of said data constellations for converting said multi-bit data signal into said plurality of transmission symbols.

9. The method of claim 8, further comprising:

converting each of said transmission symbols to a corresponding multi-bit value; and selecting a number of the most significant bits of each of said multi-bit values corresponding to said selected data constellation to provide the data bits represented by the respective symbol.

10. The method of claim 9 wherein said multi-bit values are expressed in two's complement form, and inverting the most significant bit of each of said selected number of bits to obtain said data bits.

11. The method of claim 8 wherein each of said data constellations corresponds to a multilevel VSB data constellation.

12. The method of claim 11 wherein said multilevel VSB data constellations comprise at least 16, 8, 4 and 2 level VSB data constellations.

13. A method of converting a multi-bit data signal into a plurality of transmission symbols comprising:

defining a family of data constellations each having a different packing density within a given range of values and wherein slice points and data levels of each of said data constellations are coincident with selected slice points of the next more densely packed one of said data constellations;

providing a multi-bit data signal;

using a selected one of said data constellations to form said plurality of transmission symbols;

converting each of said symbols into a corresponding multi-bit value; and selecting a number of the most significant bits of each of said multi-bit values corresponding to said selected data constellation to provide the data bits represented by the respective symbol.

14. The method of claim 13 wherein said multi-bit values are expressed in two's complement form and inverting the most significant bit of each of said selected number of bits.

15. The method of claim 14 wherein each of said data constellations correponds to a multilevel VSB data constellation.

16. The method of claim 15 wherein said multilevel VSB data constellations comprise at least 16, 8, 4 and 2 level VSB data constellations.

17. A digital data processor comprising:

means for developing an information signal comprising a plurality of regularly spaced multilevel symbols, each of said symbols representing a predetermined number of data bits;

means for converting each of said symbols into a corresponding multi-bit value;

means for selecting a number of the least significant bits of each of said multi-bit values for generating an error signal; and means responsive to said error signal for processing said multi-bit values.

18. The data processor of claim 17 wherein said predetermined number comprises an integer N and wherein said selected number of least significant bits comprises a number inversely related to the value of N.

19. The data processor of claim 18 wherein said selecting means comprises means for limiting said error signal to a given number of bits.

20. The data processor of claim 18 wherein N comprises one of the integers 4, 3, 2 or 1 and wherein the corresponding selected numbers of least significant bits respectively comprise 5, 6, 7 and 8.

21. A digital data processor comprising:

means for developing an in-phase component I of an information signal in the form of a plurality of regularly spaced multilevel symbols each representing a predetermined number of data bits;

means for converting each of said symbols into a corresponding multi-bit value;

a data processor responsive to said multi-bit values for generating an in-phase output signal comprising a plurality of multi-bit values and a related quadrature output signal comprising a plurality of multi-bit values;

first means for selecting a number of the least significant bits of each of said multi-bit values of said in-phase output signal for generating an error signal; and second means for selecting a fixed number of the most significant bits of each of said multi-bit values of said quadrature output signal for generating a quantizing signal;

said data processor being responsive to said error and quantizing signals for generating said in-phase and quadrature output signals.

22. The data processor of claim 21 wherein said predetermined number comprises an integer N and wherein said selected number of least significant bits comprises a number inversely related to the value of N.

23. The data processor of claim 22 wherein said first selecting means comprises means for limiting said error signal to a given number of bits.

24. The data processor of claim 22 wherein N comprises one of the integers 4, 3, 2 or 1 and wherein the corresponding selected numbers of least significant bits respectively comprise 5, 6 7 and 8.

25. The data processor of claim 24 wherein said fixed number of most significant bits comprises 4.

* * * * *